(12) United States Patent
Wu et al.

(10) Patent No.: US 7,719,094 B2
(45) Date of Patent: May 18, 2010

(54) SEMICONDUCTOR PACKAGE AND MANUFACTURING METHOD THEREOF

(75) Inventors: Chia-Fu Wu, Kaohsiung (TW); Cheng-Yin Lee, Tainan (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 106 days.

(21) Appl. No.: 12/203,314

(22) Filed: Sep. 3, 2008

(65) Prior Publication Data

US 2009/0079044 A1  Mar. 26, 2009

(30) Foreign Application Priority Data

Sep. 20, 2007 (TW) .............................. 96135077 A

(51) Int. Cl.
  *H01L 23/495* (2006.01)
  *H01L 21/50* (2006.01)
  *H01L 21/48* (2006.01)
  *H01L 21/44* (2006.01)

(52) U.S. Cl. ............... 257/666; 257/676; 257/E23.047; 257/E23.031; 438/123; 438/112; 438/124

(58) Field of Classification Search ................ 257/666, 257/676, E23.047, E23.031; 438/123, 112, 438/124
See application file for complete search history.

(56) References Cited

U.S. PATENT DOCUMENTS

| 6,337,510 | B1 * | 1/2002 | Chun-Jen et al. ............ 257/666 |
| 6,459,148 | B1 * | 10/2002 | Chun-Jen et al. ............ 257/692 |
| 6,803,648 | B1 * | 10/2004 | Kelkar et al. ................ 257/676 |
| 7,476,962 | B2 * | 1/2009 | Kim .......................... 257/686 |
| 2006/0261453 | A1 * | 11/2006 | Lee et al. .................... 257/676 |

* cited by examiner

*Primary Examiner*—Luan C Thai
(74) *Attorney, Agent, or Firm*—J.C. Patents

(57) ABSTRACT

A semiconductor package includes a lead frame, at least one chip, and an encapsulation. The lead frame has a plurality of leads, and each of the leads includes at least one first conductive part, at least one second conductive part, and at least one third conductive part. The first conductive part is not electrically connected to the second conductive part, and the second conductive part is electrically connected to the third conductive part. The chip is electrically connected to the first conductive part. The encapsulation encapsulates the chip and at least a portion of the lead frame, and forms a first surface and a second surface opposite to the first surface. The first conductive part and the third conductive part are exposed from the first surface, and the second conductive part is exposed from the second surface.

15 Claims, 7 Drawing Sheets

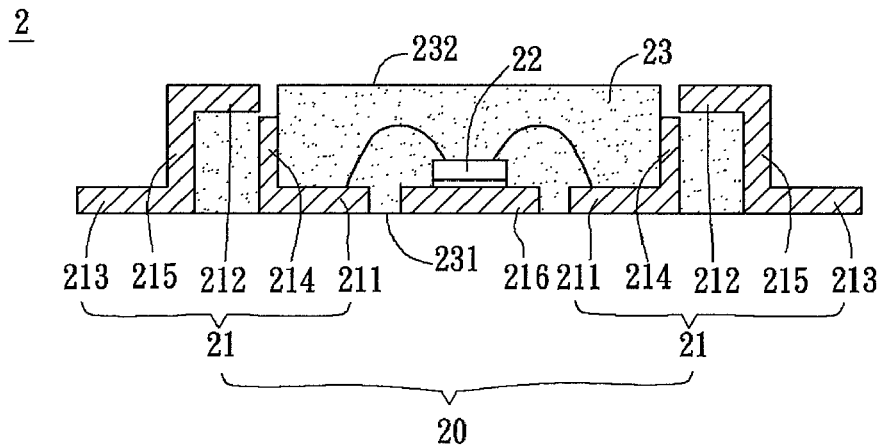

FIG. 2

| Provide a lead frame, in which the lead frame includes a plurality of leads, each lead includes at least one first conductive part, at least one second conductive part, and at least one third conductive part, and the second conductive part is electrically connected to the first conductive part and the third conductive part | S01 |
|---|---|
| Provide at least one chip, and electrically connect the chip to the first | S02 |
| Encapsulate the chip and at least a portion of the lead frame by an encapsulation, so as to form a first surface and a second surface opposite to the first surface, in which the first conductive part and the third conductive part are exposed from the first surface, and the second conductive part is exposed from the second surface | S03 |
| Separate the first conductive part from the second conductive part | S04 |

FIG. 3

SEMICONDUCTOR PACKAGE AND MANUFACTURING METHOD THEREOF

CROSS-REFERENCE TO RELATED APPLICATION

This application claims the priority benefit of Taiwan application serial no. 96135077, filed on Sep. 20, 2007. The entirety of the above-mentioned patent application is hereby incorporated by reference herein and made a part of specification.

BACKGROUND OF THE INVENTION

1. Field of the Invention

The present invention generally relates to a package and a manufacturing method thereof, in particular, to a semiconductor package having a lead frame and a manufacturing method thereof.

2. Description of Related Art

In the semiconductor technology development, the capacity and performance of semiconductor package devices are improved to meet the demands of users along with the miniaturization and high-efficiency oriented development of electronic products. Therefore, multi-chip module becomes one of the researching focuses in recent years, in which a semiconductor package device is formed by stacking two or more chips, thereby chips with different functions are integrated into a semiconductor package device. In addition, the multi-chip module may reduce a length of a connection circuit between the chips, so as to shorten a delay time and an access time of a signal.

Referring to FIG. 1, a conventional package device 1 includes a plurality of packages 11 to 14 stacked with each other. Each package 11 to 14 respectively has a chip 111, 121, 131, or 141, a lead frame 112, 122, 132, or 142, and an encapsulation 113, 123, 133, or 143. The chip 111, 121, 131, or 141 is respectively electrically connected to the lead frame 112, 122, 132, or 142. The encapsulation 113, 123, 133, or 143 respectively encapsulates the chip 111, 121, 131, or 141 and a portion of the lead frame 112, 122, 132, or 142. In addition, the lead frames 112, 122, 132, and 142 are electrically connected to each other.

The semiconductor package device 1 has an improved operating performance due to the chips 111, 121, 131, and 141. However, for signal transmission, the chips 111, 121, 131, and 141 share the lead frame 112 as an input/output (I/O) port, such that it is difficult to control the signal. Because of the limit of the number of the I/O ports, the semiconductor package device 1 is not applicable to package the chip with complicated wires, and the stacking number of the package may also be limited.

Therefore, it becomes one of the important topics how to provide a semiconductor package capable of increasing the number of the I/O ports to improve the stacking package performance of the semiconductor package.

SUMMARY OF THE INVENTION

Accordingly, the present invention is directed to a semiconductor package and a manufacturing method thereof, capable of increasing the number of I/O ports and improving a stacking package performance.

As embodied and broadly described herein, the present invention provides a semiconductor package, which includes a lead frame, at least one chip, and an encapsulation. The lead frame has a plurality of leads, and each lead includes at least one first conductive part, at least one second conductive part, and at least one third conductive part. The first conductive part is not electrically connected to the second conductive part, and the second conductive part is electrically connected to the third conductive part. The chip is electrically connected to the first conductive part. The encapsulation encapsulates the chip and at least a portion of the lead frame, and forms a first surface and a second surface opposite to the first surface. The first conductive part and the third conductive part are exposed from the first surface, and the second conductive part is exposed from the second surface.

The present invention provides a manufacturing method of a semiconductor package, which includes the following steps. Firstly, A lead frame is provided, in which the lead frame has a plurality of leads, each lead includes at least one first conductive part, at least one second conductive part, and at least one third conductive part, and the second conductive part is electrically connected to the first conductive part and the third conductive part. Then, at least one chip is provided, and the chip is electrically connected to the first conductive part. The chip and at least a portion of the lead frame is encapsulated by an encapsulation, so as to form a first surface and a second surface opposite to the first surface, in which the first conductive part and the third conductive part are exposed from the first surface, and the second conductive part is exposed from the second surface. Finally, the first conductive part is separated from the second conductive part.

Accordingly, in the semiconductor package and the manufacturing method thereof according to the present invention, the second conductive part of the lead frame is electrically connected to the third conductive part of the lead frame, so as to serve as the I/O port of the externally connected electronic device stacked on the semiconductor package. The first conductive part is not electrically connected to the second conductive part, so as to serve as the I/O port of the chip. As compared with the conventional art, the chip of the semiconductor package of the present invention may transmit signals through the first conductive part, and the externally connected electronic device may transmit signals through the second conductive part and the third conductive part, such that the semiconductor package may provide more I/O ports on the first surface to support more signal transmission, thereby improving the stacking package performance.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 2 is a schematic view of a semiconductor package structure according to an embodiment of the present invention.

FIG. 3 is a flow chart of processes of a manufacturing method of the semiconductor package according to the embodiment of the present invention.

DESCRIPTION OF THE EMBODIMENTS

Figure 1:
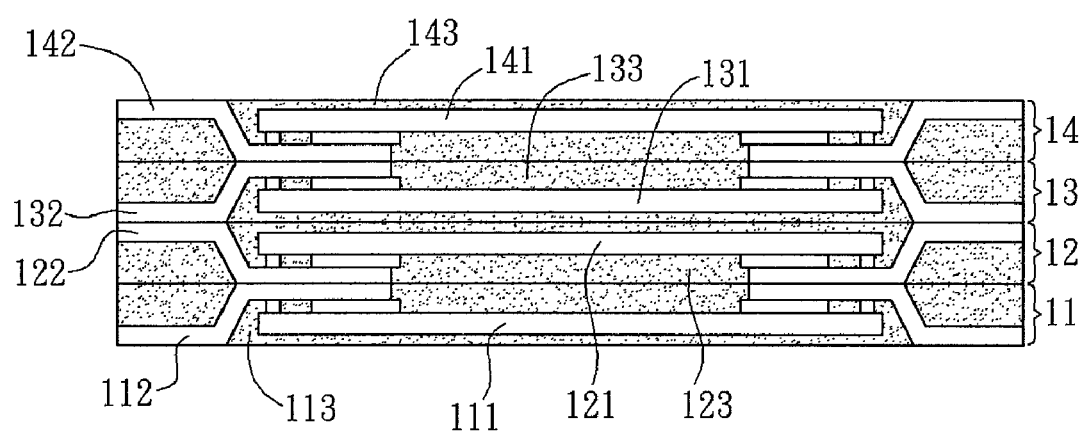
FIG. 1 is a schematic view of a conventional semiconductor package device.

In the following, referring to relative drawings, a semiconductor package and a manufacturing method thereof according to an embodiment of the present invention are described, in which the same elements are marked by the same reference numerals.

Referring to FIG. 2, a semiconductor package 2 according to an embodiment of the present invention includes a lead frame 20, at least one chip 22, and an encapsulation 23. In this embodiment, the semiconductor package 2 is, for example, but not limited to, a quad flat package (QFP).

The lead frame 20 has a plurality of leads 21, in which each lead 21 includes at least one first conductive part 211 at least one second conductive part 212, and at least one third conductive part 213. The first conductive part 211 is not electrically connected to the second conductive part 212, and the second conductive part 212 is electrically connected to the third conductive part 213. An uplifting portion 214 is disposed between the first conductive part 211 and the second conductive part 212, and a downward extending portion 215 is disposed between the second conductive part 212 and the third conductive part 213. The chip 22 is disposed on a chip carrier 216 of the lead frame 20, and is, for example, electrically connected to the first conductive part 211 by wire bonding.

The encapsulation 23 encapsulates the chip 22 and at least a portion of the lead frame 20, and forms a first surface 231 and a second surface 232 opposite to the first surface 231. A material of the encapsulation 23 is, for example, epoxy resin.

The first conductive part 211 and the third conductive part 213 are exposed from the first surface 231, and the second conductive part 212 is exposed from the second surface 232. The first conductive part 211 is used as the I/O port of the chip 22, and the second conductive part 212 and the third conductive part 213 are used as the I/O port of the electrically connected electronic device stacked on the semiconductor package 2. The electronic device may be selected from a group consisting of a chip, a package, a multi-chip module (MCM), a multi-package module (MPM), and any combination thereof.

Referring to FIG. 3, a manufacturing method of the semiconductor package according to the embodiment of the present invention includes Steps S01 to S04. Referring to FIGS. 3, 4A to 4D, the manufacturing flow of the semiconductor package 2 is further described.

Figure 4A:
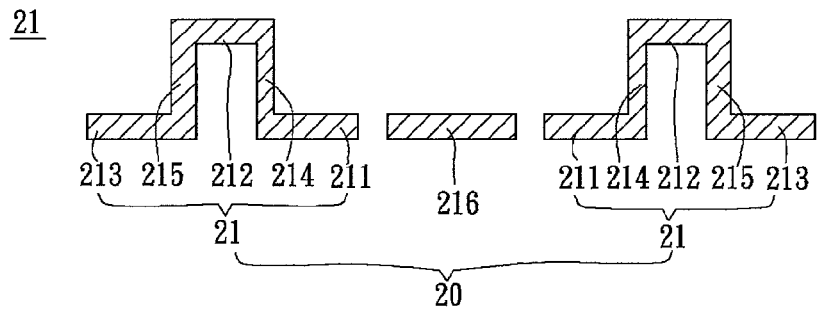
FIGS. 4A to 4D are schematic view of the manufacturing method of FIG. 3.

Referring to FIGS. 3 and 4A, in Step S01, a lead frame 20 is provided. The lead frame 20 has a plurality of leads 21, in which each lead 21 includes at least one first conductive part 211, at least one second conductive part 212, and at least one third conductive part 213. The second conductive part 212 is electrically connected to the first conductive part 211 and the third conductive part 213. An uplifting portion 214 is disposed between the first conductive part 211 and the second conductive part 212, and a downward extending portion 215 is disposed between the second conductive part 212 and the third conductive part 213.

Figure 4B:
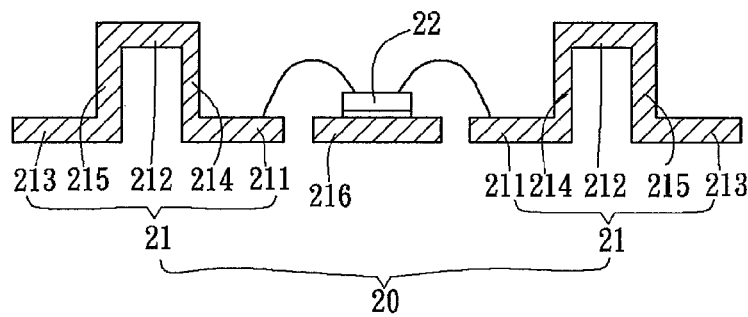
Figure 4C:
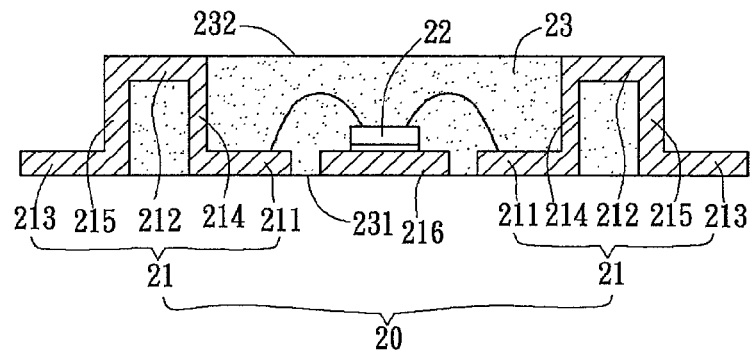

Referring to FIGS. 3 and 4B, in Step S02, at least one chip 22 is provided, and the chip 22 is electrically connected to the first conductive part 211. The chip 22 may be adhered to a chip carrier 216 of the lead frame 20 through a thermal conductive adhesive. In this embodiment, an active surface of the chip 22 faces upward, so as to electrically connect to the first conductive part 211 by wire bonding. In addition, if the active surface of the chip 22 faces downward, the chip 22 can be disposed on the chip carrier 216 by flip-chip bonding, and the chip carrier 216 is used as a conductive part for external connection. Referring to FIGS. 3 and 4C, in Step S03, the chip 22 and at least a portion of the lead frame 20 are encapsulated by an encapsulation 23, so as to form a first surface 231 and a second surface 232 opposite to the first surface 231. The first conductive part 211 and the third conductive part 213 are exposed from the first surface 231, and the second conductive part 212 is exposed from the second surface 232.

Figure 4D:
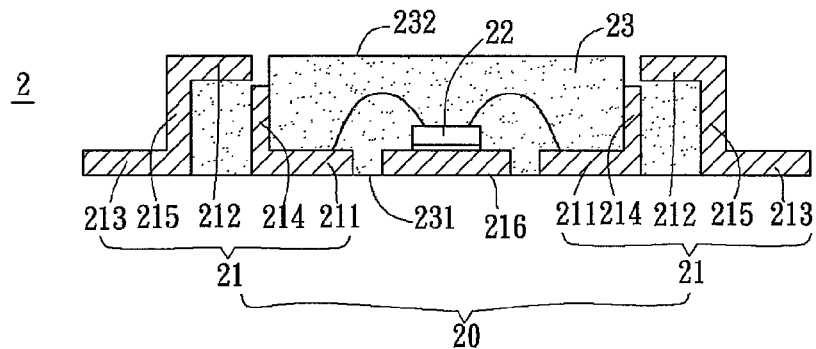

Referring to FIGS. 3 and 4D, in Step S04, the first conductive part 211 is separated from the second conductive part 212, in which the separating manner may be, for example, sawing, laser cutting, or etching.

Figure 5:
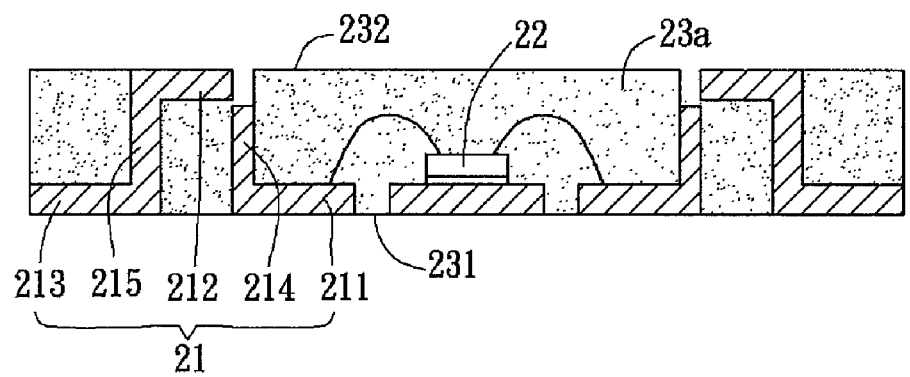
FIG. 5 is a schematic view of an alternative aspect of the semiconductor package according to the present invention.

The semiconductor package structure of the present invention may have different alternative aspects. Referring to FIG. 5, a semiconductor package 2a is different from the semiconductor package 2 that an encapsulation 23a of the semiconductor package 2a further encapsulates a portion of the third conductive part 213 exposed at side for serving as the leads, such that the semiconductor package 2a is a quad flat non-leaded package (QFN).

Figure 6:
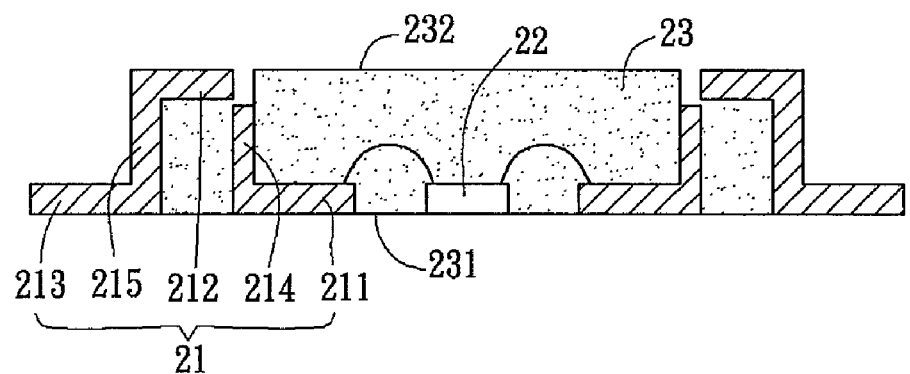
FIG. 6 is a schematic view of another alternative aspect of the semiconductor package according to the present invention.

Referring to FIG. 6, another alternative aspect of the semiconductor package of the present invention is shown. A semiconductor package 2b is different from the semiconductor package 2 that a back side of the chip 22 of the semiconductor package 2b is exposed from the first surface 231 of the encapsulation 23 instead of being disposed on the chip carrier.

Figure 7A:
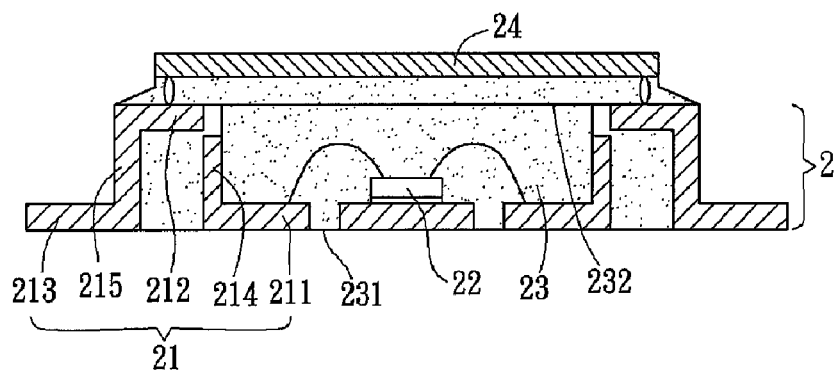
FIGS. 7A to 7C, 8A, 8B, and 9 are schematic views of the semiconductor package according to the present invention externally connecting to an electronic device.
Figure 7B:
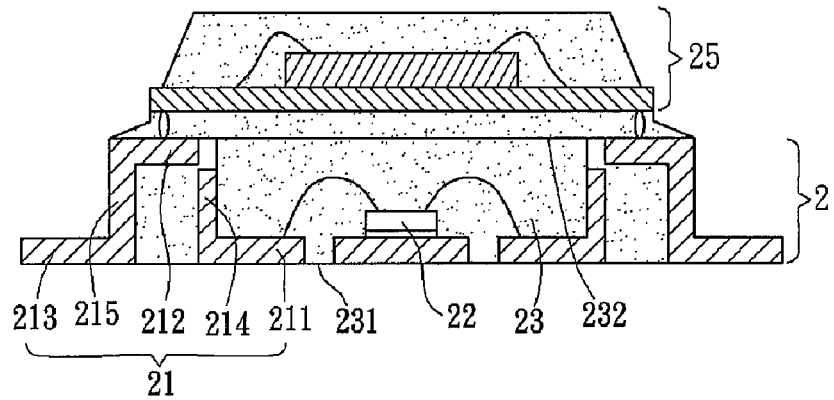
Figure 7C:
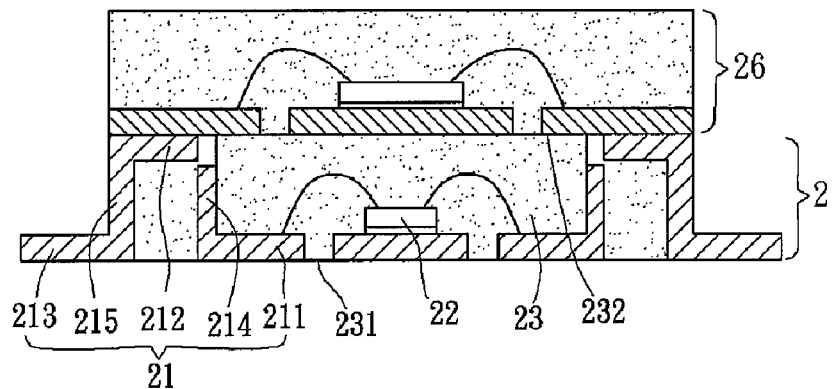

The manufacturing method of the semiconductor package according to the present invention further includes a step of electrically connecting the semiconductor package 2 to at least one electronic device, that is, externally connecting to other electronic devices through the second conductive part 212. Referring to FIG. 7A, a chip 24 is electrically connected to the second conductive part 212, the chip 24 is, for example, flip-chip bonded to the second conductive part 212, and an underfill may be filled between the chip 24 and the semiconductor package 2, for protecting the electronic device. Referring to FIG. 7B, a package 25, for example, a ball grid array (BGA) package is bonded to the second conductive part 212 by using surface mount technology (SMT). Referring to FIG. 7C, a package 26, for example, a package with a lead frame, is electrically connected to the second conductive part 212 by using the SMT. Here, the type of the electronic device is not limited, for example, the electronic device may be selected from a group consisting of a chip, a package, a MCM, a MPM, and any combination thereof.

The externally connected electronic device is electrically connected to the third conductive part 213 through the second conductive part 212, such that the electronic device may transmit signals through the second conductive part 212 and the third conductive part 213, and the chip 22 transmits signals through the first conductive part 211, thereby providing more I/O ports on the first surface 231.

Figure 8A:
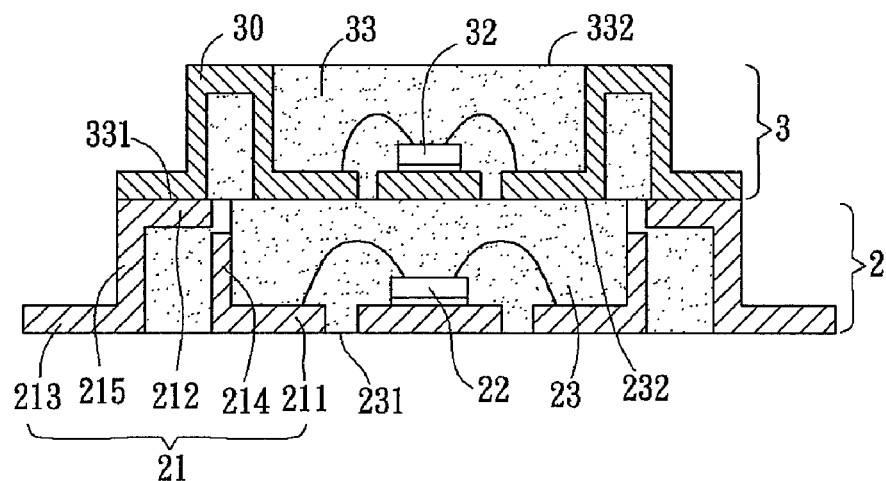
Figure 8B:
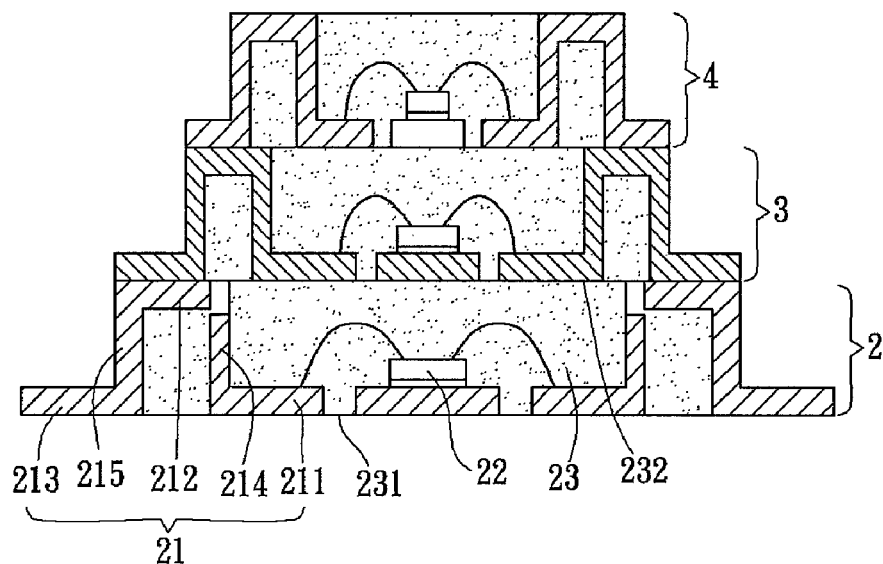

Referring to FIG. 8A, a package 3 is electrically connected to the second conductive part 212. The package 3 has a lead frame 30, a chip 32, and an encapsulation 33. The chip 32 is wire-bonded to the lead frame 30, and the encapsulation 33 encapsulates the chip 32 and a portion of the lead frame 30, and forms a first surface 331 and a second surface 332 opposite to the first surface 331. A portion of the lead frame 30 is exposed from the first surface 331 and is electrically connected to the second conductive part 212, and a portion of the lead frame 30 is exposed from the second surface 332, for electrically connecting to other electronic devices. Referring to FIG. 8B, a package 4 may be further stacked on and electrically connected to the package 3.

Figure 9:
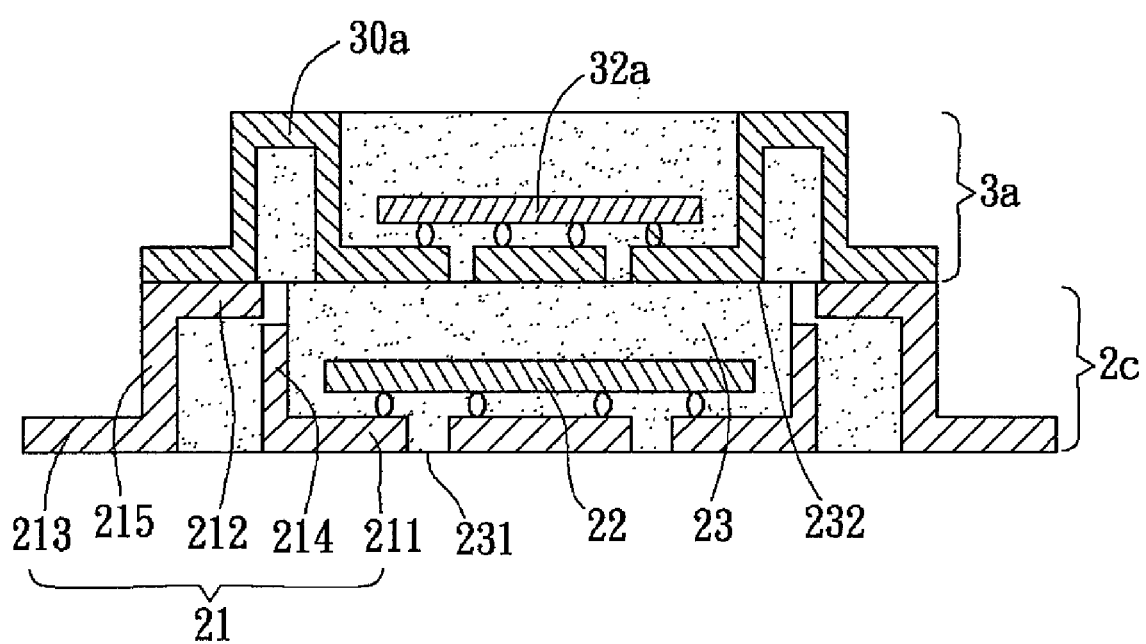

Referring to FIG. 9, a package 3a is electrically connected to the semiconductor package 2c through the second conductive part 212, and the chip 22 of the semiconductor package 2c is flip-chip bonded to the first conductive part 211 and the chip carrier 216. Definitely, the chip 22 may also be flip-chip bonded and wire-bonded to the first conductive part 211 at the same time. The package 3a has a lead frame 30a and a chip 32a, and the chip 32a is flip-chip bonded to the lead frame 30a.

To sum up, in the semiconductor package and the manufacturing method thereof according to the present invention, the second conductive part of the lead frame is electrically connected to the third conductive part of the lead frame, so as to serve as the I/O port of the externally connected electronic devices stacked on the semiconductor package. The first conductive part is not electrically connected to the second conductive part, so as to serve as the I/O port of the chip. As compared with the conventional art, the chip of the semiconductor package of the present invention may transmit signals through the first conductive part, and the externally connected electronic devices may transmit signals through the second conductive part and the third conductive part, such that the semiconductor package may provide more I/O ports on the first surface to support more signal transmission, thereby improving the stacking package performance.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A semiconductor package, comprising:
   a lead frame, comprising a plurality of leads, wherein each lead comprises at least one first conductive part, at least one second conductive part, and at least one third conductive part, the first conductive part is not electrically connected to the second conductive part, and the second conductive part is electrically connected to the third conductive part;
   at least one chip, electrically connected to the first conductive part; and
   an encapsulation, encapsulating the chip and at least a portion of the lead frame, and forming a first surface and a second surface opposite to the first surface,
   wherein the first conductive part and the third conductive part are exposed from the first surface, and the second conductive part is exposed from the second surface.

2. The semiconductor package according to claim 1, wherein an uplifting portion is further disposed between the first conductive part and the second conductive part.

3. The semiconductor package according to claim 1, wherein a downward extending portion is further disposed between the second conductive part and the third conductive part.

4. The semiconductor package according to claim 1, wherein a back side of the chip is exposed from the first surface of the encapsulation.

5. The semiconductor package according to claim 1, wherein the lead frame further comprises a chip carrier for carrying the chip.

6. The semiconductor package according to claim 1, wherein the chip is electrically connected to the first conductive part by flip-chip bonding and/or wire bonding.

7. The semiconductor package according to claim 1, wherein the second conductive part is electrically connected to at least one electronic device.

8. The semiconductor package according to claim 7, wherein the electronic device is selected from a group consisting of a chip, a package, a multi-chip module (MCM), a multi-package module (MPM), and any combination thereof.

9. The semiconductor package according to claim 1, wherein the semiconductor package is a quad flat package (QFP) or a quad flat non-leaded package (QFN).

10. A manufacturing method of a semiconductor package, comprising:
    providing a lead frame, wherein the lead frame comprises a plurality of leads, each lead comprises at least one first conductive part, at least one second conductive part, and at least one third conductive part, and the second conductive part is electrically connected to the first conductive part and the third conductive part;
    providing at least one chip, and electrically connecting the chip to the first conductive part; and
    encapsulating the chip and at least a portion of the lead frame by an encapsulation, so as to form a first surface and a second surface opposite to the first surface, wherein the first conductive part and the third conductive part are exposed from the first surface, and the second conductive part is exposed from the second surface; and
    separating the first conductive part from the second conductive part.

11. The manufacturing method according to claim 10, wherein the separating manner is sawing, laser cutting, or etching.

12. The manufacturing method according to claim 10, wherein the chip is electrically connected to the first conductive part by flip-chip bonding and/or wire bonding.

13. The manufacturing method according to claim 10, further comprising electrically connecting the second conductive part to at least one electronic device.

14. The manufacturing method according to claim 13, wherein the electronic device is selected from a group consisting of a chip, a package, a multi-chip module (MCM), a multi-package module (MPM), and any combination thereof.

15. The manufacturing method according to claim 10, wherein the semiconductor package is a quad flat package (QFP) or a quad flat non-leaded package (QFN).

* * * * *